United States Patent [19]

Inoue et al.

[11] Patent Number: 4,823,041

[45] Date of Patent: Apr. 18, 1989

[54] NON-DIRECTIONAL ULTRASONIC TRANSDUCER

[75] Inventors: Takeshi Inoue, Tokyo; Masashi Konno, Yamagata, both of Japan

[73] Assignee: NEC Corporation, Tokyo, Japan

[21] Appl. No.: 69,057

[22] Filed: Jul. 2, 1987

[30] Foreign Application Priority Data

| | | | |
|---|---|---|---|
| Jul. 2, 1986 | [JP] | Japan | 61-156412 |
| Jul. 2, 1986 | [JP] | Japan | 61-156413 |
| Sep. 7, 1986 | [JP] | Japan | 61-162263 |
| Sep. 7, 1986 | [JP] | Japan | 61-162264 |

[51] Int. Cl.$^4$ ............ H01L 41/08

[52] U.S. Cl. ............ 310/322; 310/337; 310/369; 367/155; 367/159

[58] Field of Search ............ 310/328, 337, 369, 322, 310/323; 367/155, 157, 159, 180

[56] References Cited

U.S. PATENT DOCUMENTS

| | | | |
|---|---|---|---|
| 3,230,505 | 1/1966 | Parker et al. | 310/337 X |
| 3,509,522 | 4/1970 | Whitfill, Jr. | 310/337 X |
| 3,716,828 | 2/1973 | Massa | 310/337 X |
| 4,220,887 | 9/1980 | Kompanek | 310/337 X |
| 4,525,645 | 6/1985 | Shirley et al. | 310/337 |
| 4,706,229 | 11/1987 | Congdon | 310/337 X |

*Primary Examiner*—Mark O. Budd
*Attorney, Agent, or Firm*—Helfgott & Karas

[57] ABSTRACT

A transducer is comprised of a piezoelectric ceramic cylindrical vibrator vibrating radially, and a sheet provided on an outer peripheral surface of the cylindrical vibrator and including a fiber reinforced composite material with fibers oriented only in the direction of central axis of the cylindrical vibrator. Non-piezoelectric cylinder consisting of Al alloy or Mg alloy may be useable instead of the sheet. Another type of transducer includes a cylindrical piezo-transducer vibrating radially, a cylindrical sound radiator with the central axis coincident with the cylindrical piezo-transducer, and a bending coupler provided at a predetermined interval on end surfaces of the two cylinders and coupling the cylindrical piezo-transducer and the cylindrical sound radiator. Other type of transducer is comprised of a cylindrical piezo-transducer vibrating radially, an outside cylindrical sound radiator with its central axis coincident with the central axis of the cylindrical piezo-transducer which contains the piezo-transducer therein, and a coupler extending radially from an outer peripheral surface of the cylindrical piezo-transducer to an inner peripheral surface of the cylindrical sound radiator, thereby coupling both the two.

14 Claims, 5 Drawing Sheets

NON-DIRECTIONAL ULTRASONIC TRANSDUCER

BACKGROUND OF THE INVENTION

The present invention relates to a transducer and more particularly to a non-directional high power underwater ultrasonic transducer with a wide band characteristic.

A cylindrical piezoelectric ceramic transducer, shown in FIG. 1, operating under a radial mode has been used as a non-directional transducer. In the transducer, a radial polarization is effected by applying a high DC voltage between silver- or gold-baked electrodes 101, 102 formed on the inner and outer surfaces. Application of an AC voltage through electric terminals 103, 104 causes a non-directional acoustic radiation, as indicated by arrows, from the outer surface of a cylinder with reference to the central axis 0–0' under a so-called radial extensional mode.

The aforementioned conventional cylindrical piezoelectric ceramic transducer is all made of piezoelectric ceramics, therefore, the following problem may arise. That is, the piezoelectric ceramics are about $8.0\times10^3$ $kg/m^3$ in density, and a speed of sound under the radial extentional mode is 3,000 to 3,500 m/sec., so that a characteristic acoustic impedance (defined by the product of density and speed of sound) becomes $24\times10^6$–$28\times10^6$ MKS rayls, which is extremely large to be nearly 20 times as large as the characteristic acoustic impedance of a medium water. Thus, there arises a mismatching of the acoustic impedance between the water and the transducer, limiting fractional band width to 15% to 30% at best. In a sonar system, the range resolution is affected by the transmitted pulse trails. The pulse trails becomes longer with the decrease of the band width of the transducer. Therefore, a broad-band transducer will be indispensable for the sonar system. In the cylindrical piezoelectric ceramic transducer, in order to improve the impedance matching with water, or to obtain a broadband characteristic, it is necessary that a mechanical impedance of the transducer be minimized (or a mass of the transducer per acoustic radiation area be minimized). For this purpose there has been tried to thin a wall thickness of the cylindrical transducer. However, a thinned wall-transducer involves a difficulty in working the piezoelectric ceramics and a considerable deterioration of the mechanical strength, making it impossible to realize a high power acoustic radiation.

SUMMARY OF THE INVENTION

An object of the invention is, therefore, to provide a non-directional transducer having a broad-band characteristic.

Another object of the invention is to provide a non-directional transducer having a high efficiency acoustic radiation characteristic.

A further object of the invention is to provide a non-directional transducer capable of transmitting a high power.

Other object of the invention is to provide a miniaturized non-directional transducer having the aforementioned characteristics.

According to one aspect of the present invention, there is provided a transducer comprising a piezoelectric ceramic cylindrical vibrator vibrating radially, and a sheet provided on an outer peripheral surface of the cylindrical vibrator and including a fiber reinforced composite material with fibers oriented only in the direction of central axis of the cylindrical vibrator. Non-piezoelectric cylinder consisting of Al alloy or Mg alloy may be usable instead of the sheet. According to another aspect of the present invention, there is provided a transducer comprising a cylindrical piezo-transducer vibrating radially, a cylindrical sound radiator with the central axis coincident with the cylindrical piezo-transducer, and a bending coupler provided at a predetermined interval on end surfaces of the two cylinders and coupling the cylindrical piezo-transducer and the cylindrical sound radiator. According to other aspect of the present invention, there is provided a transducer comprising a cylindrical piezo-transducer vibrating radially, an outside cylindrical sound radiator with its central axis coincident with the central axis of the cylindrical piezo-transducer which contains the piezo-transducer therein, and a coupler extending radially from an outer peripheral surface of the cylindrical piezo-transducer to an inner peripheral surface of the cylindrical sound radiator, thereby coupling both the two.

Other objects and features will be clarified from the following description with reference to the drawings.

DETAILED DESCRIPTION OF THE PREFERRED EMBODIMENTS

Figure 1:
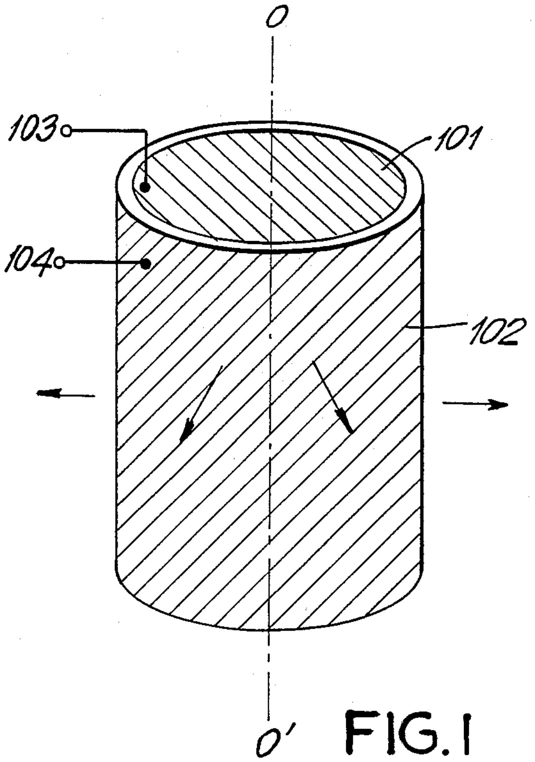
FIG. 1 is an illustration showing a conventional non-directional cylindrical piezoelectric ceramic transducer.
Figure 2B:
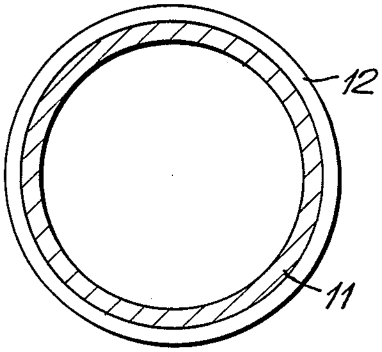
FIGS. 2A, 2B and 2C are a perspective view, a plan view and a sectional view respectively, representing one embodiment of the invention each.
Figure 2A:
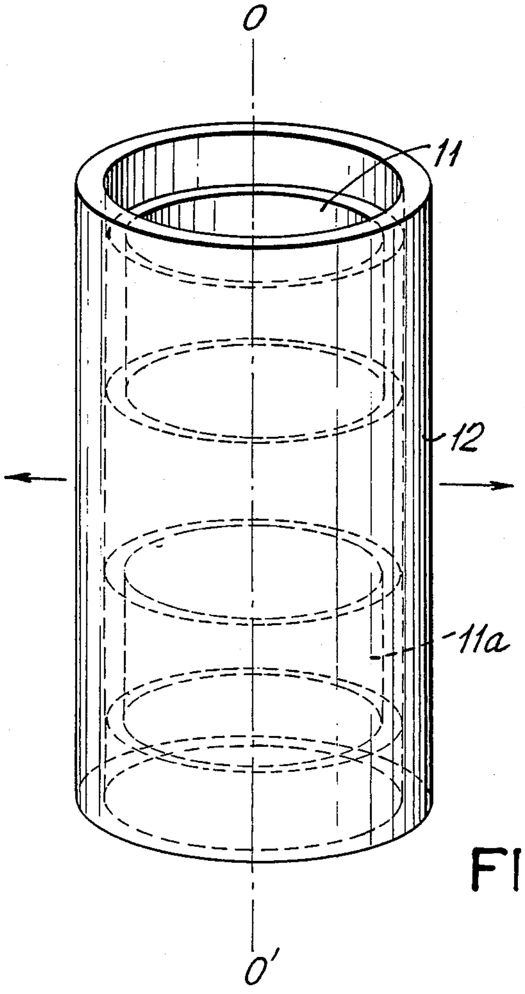
Figure 2C:
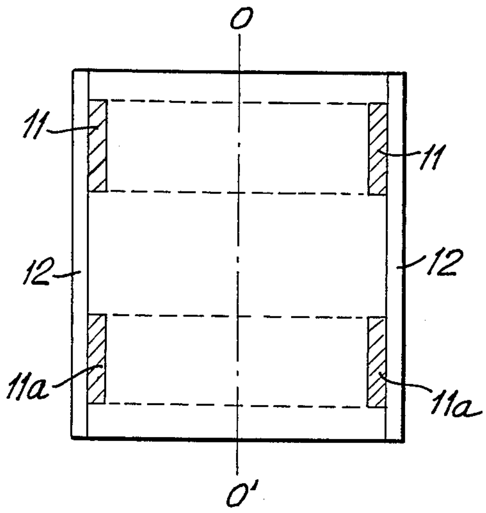

A first embodiment of the non-directional high power underwater ultrasonic transducer according to the present invention is shown in FIGS. 2A to 2C. In the drawings, reference numerals 11, 11*a* denote cylindrical piezoelectric ceramic vibrators, and 12 denotes a non-piezoelectric cylinder made of, for example, a fiber-reinforced composite material or a light metal such as Al alloy or the like. The cylinder 12 is fitted perfectly in outer surfaces of the piezoelectric ceramic vibrators 11, 11*a*. The vibrators 11, 11*a* and the non-piezoelectric cylinder 12 are bonded firmly by an adhesive and thus operate integrally for radial extensional mode transmission as indicated by arrows. While not illustrated, in a practical use, the cylinder 12 is capped on both end surfaces with a strong material such as Al alloy, steel, FRP or the like according to a known art, and an outer surface of the transducer is covered with an acoustic rubber such as neoprene rubber, chloroprene rubber or the like to realize a watertight structure.

Figure 3:
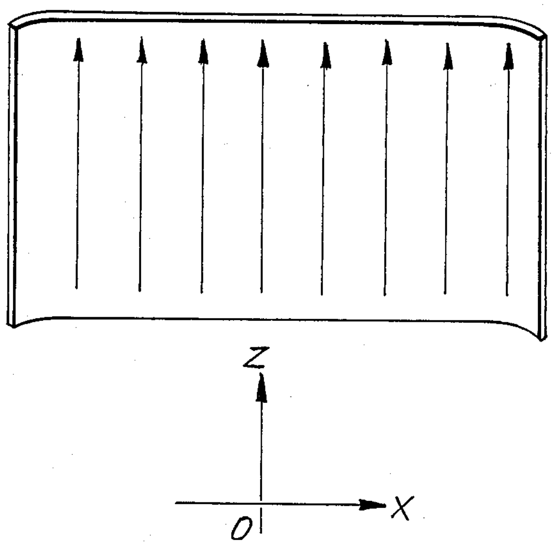
FIG. 3 is that for illustrating a sheet used in the embodiment of FIG. 2.

It is vital for the cylinder 12 to vibrate integrally with the cylindrical piezoelectric ceramic vibrators under the radial extensional mode. Consequently, a composite material with a large elastic modulus in the direction of central axis 0–0', namely C-FRP (Carbon-Fiber Reinforced Plastics) or G-FRP (Glass-Fiber Reinforced Plastics) with the fiber arranged in the direction 0–0' is preferable as a material of the cylinder 12. As shown in FIG. 3, the composite material has the fiber oriented (as indicated by arrows) so as to coincide with the central axis (Z-axis of FIG. 3) of the cylinder. Further, for easy winding on the cylindrical piezoelectric ceramic vibrators 11, 11*a*, it is flexible in the direction X-axis of FIG. 3. Since the composite material of this kind has no fiber incorporated in the circumferential direction, a speed of sound is dependent upon the plastics as a matrix, and is generally much smaller than that in the piezoelectric ceramics. Accordingly, the transducer using C-FRP or G-FRP according to the present embodiment can be realized in smaller dimensions than the conventional transducer comprising a piezoelectric ceramic cylinder unit, which is advantageous for miniaturization. Furthermore, according to this embodiment, an effective mass per unit radiation area becomes considerably smaller than the conventional transducer, therefore an acoustic impedance matching with water is remarkably improved, and thus a broad-band transducer can be realized. It is noted here that, a broad-band transducer is also obtainable by employing a fiber-reinforced metal with Al alloy, or Al and Mg with the fiber oriented in the direction of central axis as a matrix for the cylinder 12.

Figure 4:
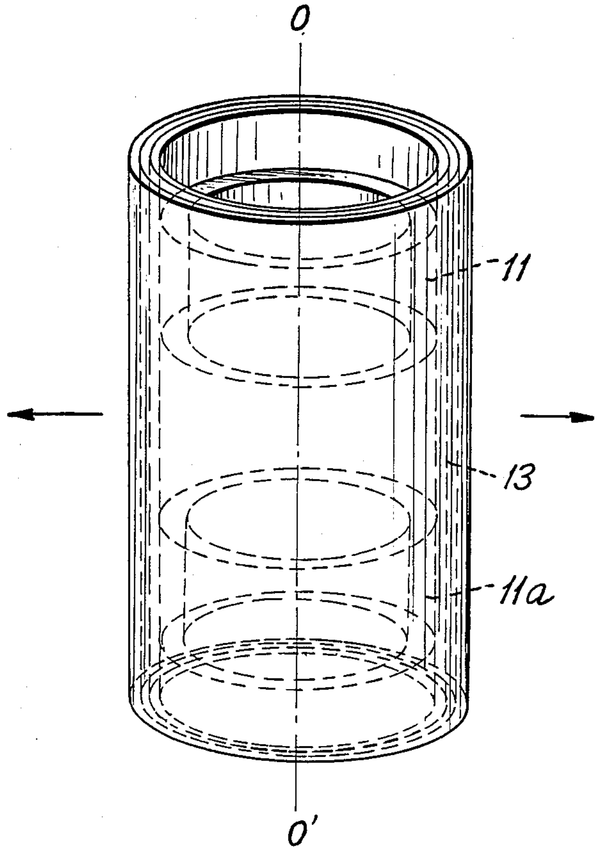
FIG. 4 is a simplified perspective view representing another embodiment of the invention.

The piezoelectric ceramics are fragile, as known well, against tension, while it is resistive satisfactorily to compressive force. It is therefore advantageous that a compression bias stress be applied on the piezoelectric ceramics for high power radiation. According to a second embodiment of the present invention, a composite material sheet is wound on the outsides of the cylindrical piezoelectric ceramic vibrators 11, 11*a* with some tension working therefor. In this case, it is difficult to give the vibrators 11, 11*a* a constant optimal bias stress stably at the time of mass production. As available measures therefor, it is very effective to supply the piezoelectric vibrators 11, 11*a* with a compressive stress by winding glass fiber, carbon fiber or alamide fiber on the surface of the cylinder 12 or directly on peripheral surfaces of the ceramic vibrators 11, 11*a*. A silver-baked electrode is formed on the inside and outside of the cylindrical piezoelectric ceramic vibrators 11, 11*a*. A polarization is performed by applying a DC high field (4 KV/mm) in a 100° C. oil through the electrode. The vibrators 11, 11*a* operate in-phase for radial extensional vibration, as known well, under a mode of lateral effect 31, In FIG. 4, a cylinder 13 is comprised of C-FRP sheet wound on the vibrators 11, 11*a* four times. The C-FRP sheet has the carbon fiber oriented in the direction of the central axis 0–0' with 0.5 mm thickness. An epoxy adhesive is applied on an inside of the C-FRP sheet, and the sheet is wound tightly as applying a tension thereon so that the piezoelectric vibrators 11, 11*a* will be subjected to a compressive stress. Accordingly, the cylinder 13 has a high rigidity to a flexure deformation in the direction of the central axis 0–0', and thus is capable of vibrating under a uniform radial extensional mode, as indicated by arrows, responsive to the radial extensional mode of the cylindrical piezoelectric ceramic vibrators.

The cylindrical vibrators, 11, 11*a* in the embodiment are of a shape, 5 mm thick and 3 cm high. The transducer is then 12 cm in height and 10 cm in outside diameter. As is well known, the transducer of the embodiment may secure watertightness from having both upper and lower surfaces capped with FRP disk, Al plate and the like and molded entirely with neoprene rubber. Under such condition, it operates on a center frequency at 9.5 KHz, and a fractional band width exceeding 40% can be realized in radiating and receiving sensitivities.

A transducer using an Al alloy for the non-piezoelectric cylinder 12 in FIG. 2 will be described. In FIG. 2A, the piezoelectric ceramic cylindrical vibrators 11, 11*a* and the Al alloy-made cylinder 12 are bonded by means of an organic adhesive. Since a thermal expansion coefficient of Al alloy is much greater than that of the piezoelectric ceramics, the Al alloy-made cylinder 12 is heated up to 100° C. to 150° C. and then the piezoelcctric ceramic vibrators 11, 11*a* are inserted therein. Then, a compressive stress is applied to the vibrators 11, 11*a*, at the ordinary temperature, which will be advantageous so much to high power operation. In the transducer of this embodiment, a speed of sound in Al alloy is greater than that in the piezoelectric ceramics, and hence as compared with the embodiment given in FIG. 4, a resonance frequency becomes high when a transducer of the same dimensions is fabricated. Concretely, if the transducer is the same in dimensions as the transducer shown in FIG. 4, the resonance frequency will be 14.9 kHz. Accordingly, when compared with a transducer of the same frequency, the transducer of this embodiment will be large in diameter as compared with the conventional cylindrical piezoelectric ceramic transducer and the transducer shown in the embodiment of FIG. 4.

However, the above will be advantageous when a transducer requires electronic devices for performing multifunctions inside the transducer. As in the case of the aforementioned embodiment, a mass per unit radiation area of the transducer of this embodiment can be minimized as compared with the conventional cylindrical piezoelectric ceramic transducer, a broad-band characteristic can be realized, and thus a 3 dB fractional band width of 40% or over can be easily realized. As will be clearly understandable from the foregoing, the number of the piezoelectric ceramic vibrators working as a driving source of the transducer may be arbitrarily selected.

Figure 5:
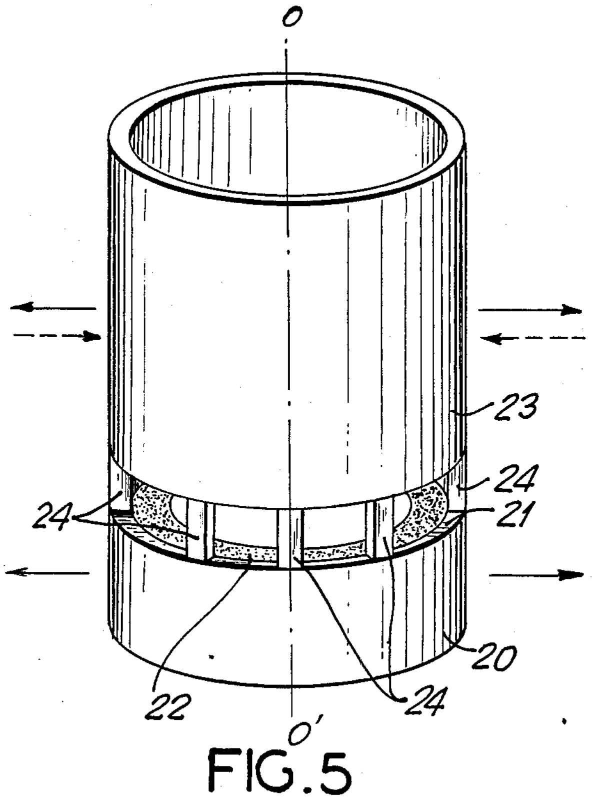
FIG. 5 is a perspective view representing a further embodiment of the invention.

In FIG. 5 representing another embodiment of the invention, a reference numeral 20 denotes a cylindrical piezo-transducer, 23 denotes a cylindrical sound radiaror, and 24 denotes a bending coupler. The cylindrical piezo-transducer 20 comprises an inside piezoelectric ceramic cylindrical vibrator 22, an outside cylinder 21 made of metal or fiber-reinforced composite material, and the vibrator 22 and the cylinder 21 are bonded tightly by an adhesive. The piezoelectric ceramic cylindrical vibrator 22 has, for example, an electrode provided on both upper and lower surfaces or on inner and outer peripheral surfaces, a piezoelectric property can be given by a polarization through these electrodes. A radial extensional vibration under the lateral effect 31 mode can be excited emphatically. Then, in case the radial extensional vibration is excited emphatically under a stiffened 33 mode, the piezoelectric ceramic cylinder is divided radially by a plane rectangular to the circumference, as known well hitherto, electrodes are formed on planes rectangular to the circumference obtained through division, a polarization is carried out through the electrodes.

The cylindrical piezo-transducer 20, the piezoelectric ceramic cylindrical vibrator 22 and the cylinder 21 must be unified for radial extensional vibration, and it is desirable that a compression bias stress be applied on a portion of the piezoelectric ceramic vibrator 22. The reason is that the piezoelectric ceramics are fragile to tension and the strength to tension comes only in one of several of the strength to pressure, as mentioned hereinabove, therefore when the vibrator 22 expands uniformly under the radial extensional mode, a fracture can be prevented. As stated before, by using a big difference of thermal expansion coefficients between the cylinder made of metal or fiber-reinforced composite material and the piezoelectric ceramic cylindrical vibrator 22, a compression bias stress is kept applied on the portion of the piezoelectric ceramic cylindrical vibrator 22 at all times at normal operating temperature, and hence a large amplitude drive can be realized as compared with the conventional cylindrical piezoelectric ceramic vibrator.

Further, it is preferable that the cylindrical sound radiator 23 is lightweight for easy broad-band matching with water and made of a fiber-reinforced composite material with a rigidity large enough to cope with a flexure deformation for realizing a uniform radial extensional vibration, or an alloy with Al, Mg as main constituents or that for which these materials are compounded in a plural layer.

The bending coupler 24 is made preferably of a high strength of metallic material such as, for example, Al. alloy, Mg alloy, Ti alloy and steel alloy or of a fiber-reinforced composite material. Then, it goes without saying that the parts 21, 24, 23 can be integrated for construction.

Figure 6:
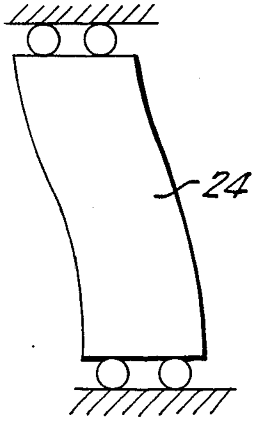
FIG. 6 is a diagram for illustrating an operation of the embodiment given in FIG. 5.

Next, an operation principle of the transducer according to the embodiment will be described. As described hereinabove, the transducer operates under two vibration modes, namely an in-phase mode and an antiphase. The in-phase mode is a vibration mode wherein the sound radiator 23 expands radially as indicated by a solid line arrow when the transducer 20 expands radially as indicated also by a solid line arrow, and a deformation is almost not caused on the bending coupler 24. The antiphase mode is a vibration mode wherein the sound radiator 23 contracts radially as indicated by a broken line arrow when the transducer expands radially as indicated by a solid line arrow. In this case, the flexure deformation arises such that, as shown in FIG. 6, a junction with the sound radiator 23 and another junction with the transducer 20 comes on roll ends each. The antiphase mode may cause a flexure deformation on the coupler 23 as compared with the in-phase mode, and a resonance frequency becomes higher than that in-phase mode due to flexure stiffness of the coupler 23. That is, there exist the in-phase mode and the antiphase mode varying each other in resonance frequency. Then, it goes without saying that when the cylindrical piezoelectric vibrator 20 contracts radially uniformly, a vibration displacement in the sound radiator 23 becomes counter to the directions indicated by the arrows in FIG. 5.

Figure 7:
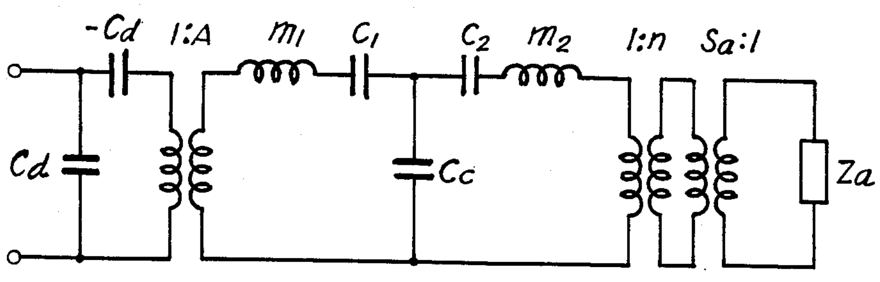
FIG. 7 is an equivalent circuit diagram of the embodiment shown in FIG. 5.

An equivalent circuit of the transducer according to the embodiment can be indicated by a lumped parameter approximated equivalent circuit shown in FIG. 7. As will be apparent from FIG. 7, the transducer according to the embodiment is totally different from a conventional single resonant transducer, and is a band pass filter with water as a sound load. In FIG. 7, $C_d$ denotes a damped capacity and $-C_d$ denotes that which appears when a stifferend mode ceramic vibrator is used, and $-C_d$ does not appear on an unstiffened mode vibrator. A reference character A denotes a power factor, $m_1$ and $c_1$ denote an equivalent mass and an equivalent compliance of the cylindrical piezoelectric vibrator 20 respectively, $m_2$ and $c_2$ denote an equivalent mass and an equivalent compliance of the cylindrical sound radiator 23 respectively, $C_c$ denotes a flexure compliance of the flexible coupler, $S_a$ denotes a sound radiation sectional area, and $Z_a$ denotes a sound radiation impedance of water in an acoustic system. It should be noted here that the present embodiment may apply to the transducer having not only the same equivalent mass and resonant frequency ($m_1=m_2$, $c_1=c_2$) but also different equivalent mass and resonant frequency ($m_1\neq m_2$, $c_1\neq c_2$). The latter transducer is called an asymmetric underwater ultrasonic transducer.

Figure 8:
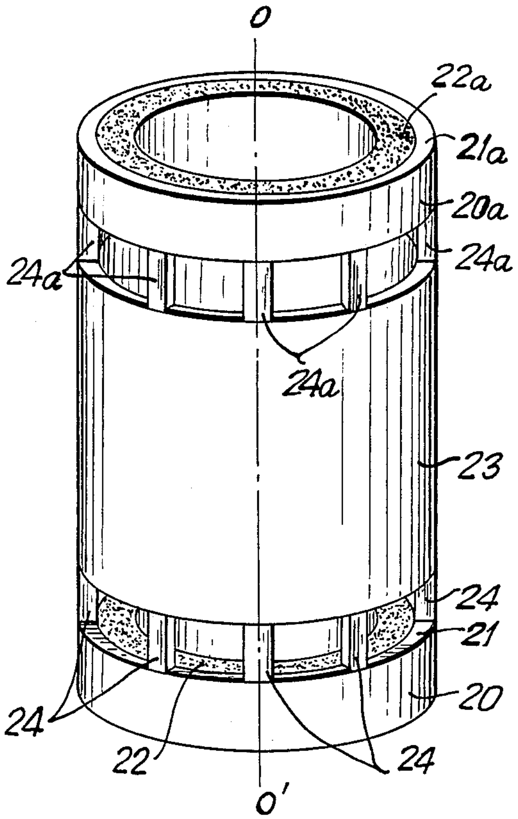
FIG. 8 is a perspective view representing another embodiment of the invention.

Another construction of the transducer according to the embodiment will be exemplified in FIG. 8. Two cylindrical piezoelectric vibrators 20, 20*a* are disposed on both the portions of the cylindrical sound radiator 23 through bending couplers 24, 24*a*, the two vibrators 20, 20*a* are then driven in-phase, thereby realizing a further uniform radial extensional mode as compared with FIG. 5. Consequently, a broad-band and non-directional high power transducer is obtainable. Here, parts 21*a*, 22*a* are constructed of the same members as 21, 22.

Figure 9:
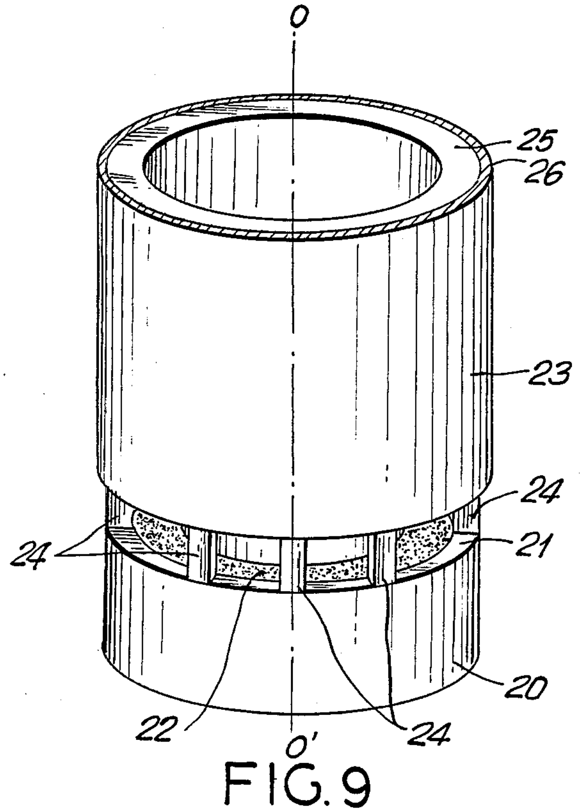
FIG. 9 is a perspective view representing a further embodiment of the invention.

In FIG. 9 representing a concrete construction of the embodiment, the piezoelectric ceramic cylinder 22 is polarized in the direction of thickness with silver-baked electrodes formed on the inner and outer peripheral surfaces. The cylinder 21 is made of Al alloy, which is bonded tightly through an epoxy adhesive at temperature of 150° C. according to the aforementioned process. Accordingly, a compression bias stress is applied and so kept on the piezoelectric ceramics at ordinary temperature. The reference numeral 25 denotes an inside cylinder of the sound radiator 23. The parts 21, 24, 25 are of an Al alloy made and so unified. A reference numeral 26 denotes a carbon fiber-reinforced plastics (C-FRP) with the epoxy resin in which fibers are disposed longitudinally of the cylindrical sound radiator 23 as a matrix, which functions as an outside cylinder. A glass fiber may be wound on an outer surface of the outside cylinder 26 to apply a compression bias stress on the cylindrical sound radiator 23, thus enhancing a bonding strength of the parts 25 and 26. A reinforced fiber such as carbon fiber: alamide fiber or the like other than the glass fiber may function likewise. The parts 25 and 26 thus vibrate integrally under the radial extensional mode, and a sound can be radiated intensively from the outer surface of the part 26. The C-FRP cylinder 26 has the fibers disposed longitudinally (0–0′ direction) of the cylinder. A flexure stiffness to the longitudinal direction in the sound radiator 23 becomes large, and thus a flexure will almost not arise on the cylinder in a usual frequency band. On the other hand, in the circumferential direction, since fibers are not disposed except that the reinforced fiber is wound somewhat on the outside of the cylinder 26, the C-FRP cylinder 26 functions as lowering a resonance frequency of the sound radiator 23. Under the diametral vibration mode, the Al alloy is greater in speed of sound by 40% or so than piezoelectric ceramics. The speed of sound under the diametrical vibration mode of the C-FRP cylinder 26 is almost equal to a speed of sound in epoxy resin working as matrix, and the speed of sound is smaller by 40% or so than that in the piezoelectric ceramics. Accordingly, in the sound radiator 23, a resonance frequency of the sound radiator 23 under the diametrical vibration mode can be controlled by changing the ratio in thickness of the Al alloy cylinder 25 to the C-FRP cylinder 26, thus coordinating easily with an optimum design value for manufacture.

The cylindrical vibrator 20 is covered with an acoustic decoupling material or cork rubber, both ends longitudinal of the transducer are capped with an Al alloy disk through the cork rubber and further molded with a neoprene rubber. A prototype transducer is 15.8 cm high and 10.5 cm diametral in outline dimensions.

Since this embodiment can utilize two resonance modes, namely in-phase mode and antiphase mode, a considerably broad band is realizable as compared with a conventional transducer. Further, according to this embodiment a broad-band sound matching can easily be attained by using a lightweight material such as Al alloy and C-FRP as the sound radiator, and high power transmission is possible by using a high strength material such as Al alloy or the like as the base material. These features make it possible to provide a transducer capable of sending a broad-band, fractional band width 60% and a high power, 190 dB relμPa at 1 m in output sound pressure with a superior sound matching efficiency with water. A formation of the cylinder 26 is so preferable but not necessarily indispensable. The bending coupler 24 may be formed directly on the piezoelectric ceramic cylindrical vibrator 22.

Figure 10:
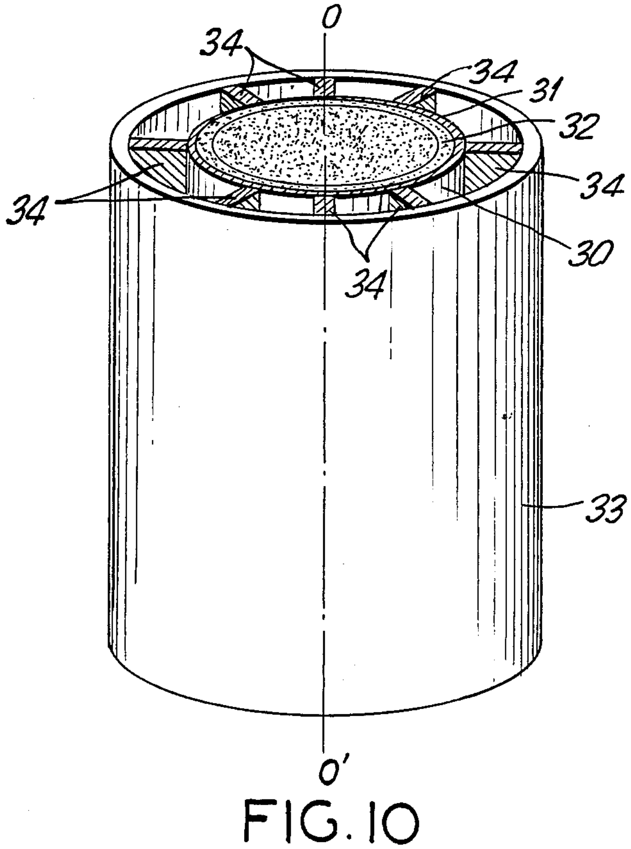
FIG. 10 is a perspective view representing a further embodiment of the invention.

In FIG. 10 representing another embodiment, a reference numeral 30 denotes a cylindrical piezo-transducer with small aperture, 33 denotes a cylindrical sound radiator with large aperture, and 34 denotes a longitudinal coupler or coupler operating under a longitudinal mode. The piezo-transducer 30 consists of an inside piezoelectric ceramic cylinder 32 and an outside cylinder 31 made of metal or fiber-reinforced composite material. Both the cylinders 31 and 32 are bonded tightly through an adhesive. The piezoelectric ceramic cylinder 32 has, for example, electrodes provided on upper and lower surfaces or on inner and outer peripheral surfaces, and a piezoelectricity can be given by polarization through the electrodes. A radial extensional vibration can be excited intensively under the lateral effect 31 mode. Then, in case the radial extensional vibration is excited intensively under the stiffened 33 mode, the piezoelectric ceramic cylinder is divided radially, as known well, by a plane rectangular to the circumference, an electrode is formed on the plane rectangular to the divided circumference, and a polarization is carried out through the electrode.

For the same reason as described before, it is essential that both the cylinders 32 and 31 be integrated to a radial extensional vibration, and it is desirable that a compression bias stress be applied and so kept on the piezoelectric ceramic vibrator 32 at all times so as to ensure a high power radiation. The application of the compression bias stress can be realized by the above-mentioned method using the big difference of the thermal expansion coefficients.

Further, it is preferable that the cylindrical sound radiator 33 is lightweight for easy broad-band matching with water and made of a fiber-reinforced composite material with large rigidity, or light metal alloy such as Al alloy, Mg alloy and the like, or that for which the fiber-reinforced composite material is compounded on the light metal alloy so as to operate for uniform radial extensional vibration on a resonance frequency in the same degree as the transducer 30 and also to realize as a large-aperture cylinder. In the case of Al alloy and Mg alloy, a speed of sound under the radial extensional mode is about 5,000 m/sec., which is about 1.6 times as fast as that in the piezoelectric ceramics, therefore when compared simply with a cylinder of the same frequency, a diameter of the cylinder made of Al alloy or Mg alloy is about 1.6 times as large as the diameter of the piezoelectric ceramic cylinder. Since a speed of sound 1.5 times to 2 times as fast as the Al alloy is obtainable from a glass fiber-reinforced composite material (G-FRP) with fibers oriented in a circumferential direction, these materials may be preferable for use as the radiator 33. On the other hand, in the piezo-transducer 30, the piezoelectric ceramics 32 with a large density occupy a mass of the transducer 30 for the major part, therefore even if a material having high speed of sound like the Al alloy is arranged for the cylinder 31, a speed of sound in the piezoelectric ceramics will be prevailing. As described above, in case the radiator 33 is realized by a material lightweight with high rigidity, there may cause a big difference in speed of sound between the transducer 30 and the sound radiator 33. The coupler 34 connects these two members 30 and 33.

A metallic material with high strength such as, for example, Al alloy, Mg alloy, Ti alloy or steel alloy or a fiber-reinforced composite material will be preferable as that of the longitudinal coupler 34. The members 31, 34, 33 may be constructed integrally.

As described hereinbefore, the transducer according to the embodiments has two vibration modes, namely in-phase mode and antiphase mode. The in-phase mode is a vibration mode wherein the sound radiator 33 expands radially likewise when the transducer 31 expands radially or a vibration mode wherein the sound radiator contracts radially uniformly likewise when the transducer 31 contracts radially uniformly, and a deformation is almost not caused in the longitudinal coupler 34. The antiphase mode is a vibration mode wherein the sound radiator contracts uniformly radially to the contrary when the transducer 30 expands radially uniformly, the coupler 34 being compressed in this case, or a vibration mode wherein the sound radiator 33 expands uniformly to the contrary when the transducer 30 contracts radially uniformly, the coupler 34 being pulled in this case. As compared with the in-phase mode, a deformation arises on the coupler 34 in the case of antiphase mode, and the resonance frequency is shifted to the higher frequency due to the stiffness of the longitudinal coupler 33. That is, in the transducer of the embodiment, there exist two resonance modes with different resonance frequency each other, namely the in-phase mode and the antiphase mode.

Figure 11:
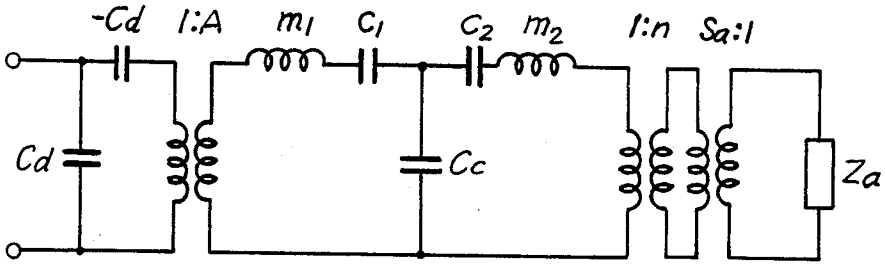
FIG. 11 is an equivalent circuit diagram of the embodiment of FIG. 10.

An equivalent circuit of the transducer according to the embodiment may be indicated by the lumped constant approximated equivalent circuit shown in FIG. 11. As will be apparent from FIG. 11, quite different from a conventional single resonance type transducer, the transducer according to the invention constitutes a band pass filter with water as a sound load. In FIG. 11, $C_d$ denotes a damped capacity and $-C_d$ denotes that which appears, as known well, when a stiffened mode ceramic vibrator is used, and $-C_d$ does not appear on an unstiffened mode vibrator. A reference character A denotes a power factor, $m_1$ and $c_1$ denote an equivalent mass and an equivalent compliance of the cylindrical piezoelectric vibrator 30, $m_2$ and $c_2$ denote an equivalent mass and an equivalent compliance of the sound radiator 33 respectively, Cc denotes a compliance of the flexible coupler, $S_a$ denotes a sound radiation sectional area, and $Z_a$ denotes a sound radiation impedance of water in an acoustic system.

In FIG. 10, the piezoelectric ceramic cylinder 32 is polarized radially in the direction of thickness through silver-baked electrodes formed on the inner and outer peripheral surfaces. The cylinder 31 is made of Al alloy, which is bonded tightly through an epoxy adhesive at temperature of 150° C. according to the aforementioned process. Accordingly, a compression bias stress is applied and so kept on the piezoelectric ceramics at ordinary temperature. The cylinder 31, the cylindrical sound radiator 33, and the longitudinal coupler 34 are of an Al alloy made and so unified.

The transducer of the embodiment has been designed so that equivalent masses and resonance frequencies of the piezo-transducer 30 and the sound radiator 33 are of a value ($m_1=m_2$, $c_1=c_2$). The transducer is kept watertight according to the aforementioned watertight technique. A prototype transducer is 6 cm high and 10.7 cm diametral in outline dimensions.

The transducer according to the embodiment is capable of radiating a broad-band 60% or over in fractional band width at a center frequency 20 kHz and a high power 190 dB rel$\mu$Pa (at lm) or over in output sound pressure level, with a superior sound matching efficiency with water.

Figure 12:
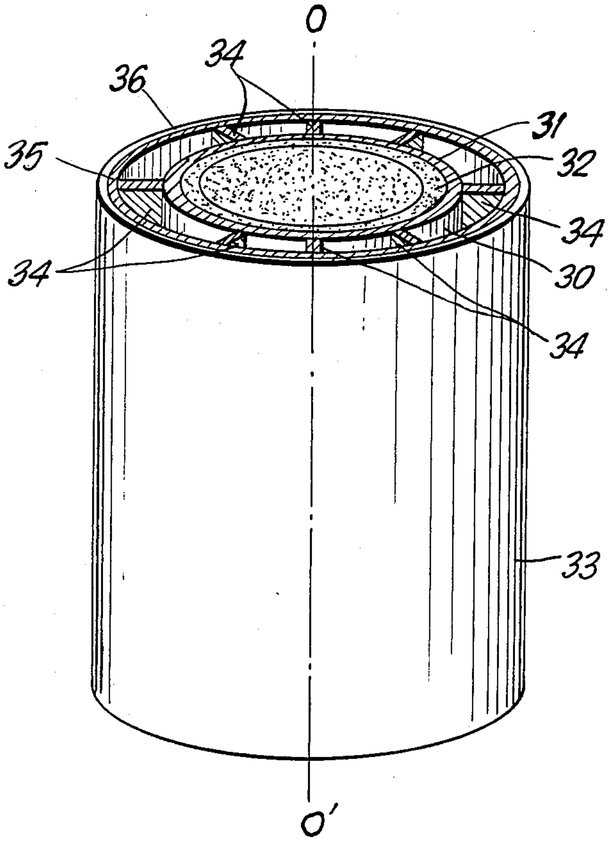
FIG. 12 is a perspective view representing an even further embodiment of the invention.

Another example of the transducer according to the embodiment is shown in FIG. 12. In FIG. 12, the transducer 30 consisting of the piezoelectric ceramic cylinder 31 and the Al alloy-made cylinder 32, and the longitudinal coupler 34 are same in construction as the example of FIG. 10. An Al alloy exactly the same as the cylinder 32 and the longitudinal coupler 34 is used for a cylinder 35 constituting a portion of the sound radiator 33, and the parts 32, 34 and 35 are unified perfectly. In the embodiment, a cylinder 36 constituting the sound radiator 33 is made of a carbon fiber-reinforced plastics (C-FRP) with carbon fibers oriented in both directions of central axis and circumference. The cylinder 36 can be realized by winding a satin C-FRP sheet on the Al alloy-made cylinder 35 through an organic adhesive. Further, a reinforced fiber such as carbon fiber, glass fiber or the like may be wound tightly on a portion of the sound radiator 33 in the direction of circumference so as to increase a bonding strength of the Al alloy cylinder 35 and the C-FRP cylinder (not indicated). This is effective in enhancing a high power transmitting level.

In the above-described embodiments, the outer surface is all functional as a sound radiation plane, therefore a multiple transducer array, may be easily arranged without trouble in mounting. The embodiment having two resonance modes, ensures the sharper frequency cut-off characteristic than the single resonance type transducer like FIGS. 2 and 4 from the view point of filter function, thus improving S/N ratio.

In each embodiment described above, a fiber-reinforced metal (FRM) may be used, needless to say, as the fiber-reinforced compound material other than FRP.

What is claimed is:

1. A transducer comprising:
two cylindrical piezo-transducers vibrating radially;
a cylindrical sound radiator disposed between said two cylindrical piezo-transducers with its central axis coincident with the central axis of said piezo-transducers; and
a bending coupler provided at a predetermined interval on end surfaces whereat said cylindrical peizo-transducers face to said cylindrical sound radiator and coupling said piezo-transducers and sound radiator.

2. The transducer according to claim 1, said two cylindrical piezo-transducers comprising each an outside cylinder consisting of a fiber reinforced compound material having a fiber axis coincident with its central axis, and a cylindrical piezoelectric ceramic vibrator provided tightly on an inner peripheral surface of said outside cylinder.

3. The transducer according to claim 2, wherein said cylindrical piezoelectric ceramic vibrator is subjected to a compression bias stress by said outside cylinder.

4. A transducer comprising:
a cylindrical piezo-transducer vibrating radially;
an outside cylindrical sound radiator with its central axis coincident with the central axis of said cylindrical piezo-transducer which contains said piezo-transducer therein; and
a coupler extending radially from an outer peripheral surface of said cylindrical piezo-transducer to an inner peripheral surface of said cylindrical sound radiator, thereby coupling both the two.

5. The transducer according to claim 4, wherein said cylindrical piezo-transducer includes a cylindrical piezoelectric ceramic vibrator, and a first cylinder consisting of a fiber reinforced composite material with the direction of fibers coincident with the direction of central axis.

6. The transducer according to claim 4, wherein said cylindrical piezo-transducer includes a cylindrical piezoelectric ceramic vibrator, and a first cylinder consisting of Al alloy or Mg alloy which contains said piezoelectric ceramic vibrator tightly therein.

7. The transducer according to claim 5, wherein said piezoelectric ceramic vibrator is subjected to a compression bias stress by said cylinder.

8. The transducer according to claim 4, wherein said cylindrical piezo-transducer and said outside cylindrical sound radiator vibrate in phase.

9. The transducer according to claim 5, wherein said cylindrical piezo-transducer and said outside cylindrical sound radiator vibrate in antiphase.

10. The transducer according to claim 5, further comprising a second cylinder consisting of a fiber reinforced composite material which is formed tightly on an inner peripheral surface of said cylindrical sound radiator.

11. The transducer according to claim 6, further comprising a second cylinder consisting of Al alloy or Mg alloy which is formed tightly on an inner peripheral surface of said cylindrical sound radiator.

12. The transducer according to claim 10, wherein said first cylinder, second cylinder and coupler are formed integrally of a fiber reinforced composite material.

13. The transducer according to claim 11, wherein said first cylinder, second cylinder and coupler are formed integrally of Al alloy or Mg alloy.

14. The transducer according to claim 4, wherein said coupler is formed in the direction of central axis entirely of peripheral surfaces of said cylindrical piezo-transducer and outside cylindrical sound radiator.

* * * * *